United States Patent
Liu

(10) Patent No.: US 9,064,703 B2
(45) Date of Patent: Jun. 23, 2015

(54) LOW TEMPERATURE POLYSILICON FILM, THIN FILM TRANSISTOR, MANUFACTURING METHOD THEREOF AND DISPLAY PANEL

(71) Applicant: BOE TECHNOLOGY GROUP CO., LTD., Beijing (CN)

(72) Inventor: Zhen Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/241,611

(22) PCT Filed: Jun. 7, 2013

(86) PCT No.: PCT/CN2013/076957
§ 371 (c)(1),
(2) Date: Feb. 27, 2014

(87) PCT Pub. No.: WO2014/172963
PCT Pub. Date: Oct. 30, 2014

(65) Prior Publication Data
US 2014/0332818 A1  Nov. 13, 2014

(30) Foreign Application Priority Data

Apr. 26, 2013  (CN) .......................... 2013 1 0150809

(51) Int. Cl.
*H01L 21/02* (2006.01)

(52) U.S. Cl.
CPC .... *H01L 21/02595* (2013.01); *H01L 21/02532* (2013.01); *H01L 21/0262* (2013.01); *H01L 21/02422* (2013.01); *H01L 21/02488* (2013.01); *H01L 21/02686* (2013.01)

(58) Field of Classification Search
CPC ..................... H01L 21/02595; H01L 21/0262; H01L 21/02532; H01L 21/02675
USPC .................................. 438/487, 488, 763, 764
See application file for complete search history.

(56) References Cited

U.S. PATENT DOCUMENTS

| | | | | |
|---|---|---|---|---|
| 6,287,944 B1 * | 9/2001 | Hara et al. | ..................... | 438/488 |
| 2001/0046755 A1 * | 11/2001 | Hara et al. | ..................... | 438/488 |
| 2002/0173147 A1 * | 11/2002 | Miyasaka | ..................... | 438/680 |

(Continued)

FOREIGN PATENT DOCUMENTS

| CN | 101245488 A | 8/2008 |
|---|---|---|
| CN | 102263014 A | 11/2011 |

(Continued)

OTHER PUBLICATIONS

Fang Ru et al. "Growth of Polycrystalline Si Layers by Plasma-Enhanced Annealing and Al-Induced Crystallization of Nanocrystalline Si Films", Chinese Journal of Vacuum Science and Technology, vol. 33, Issue 1. Jan. 2013 pp. 68-72.

(Continued)

*Primary Examiner* — Allan R Wilson
(74) *Attorney, Agent, or Firm* — Ladas & Parry LLP

(57) ABSTRACT

A low temperature polysilicon film and a manufacturing method thereof, a thin film transistor and a manufacturing method thereof and a display panel are provided. The manufacturing method of the low temperature polysilicon film includes crystallizing a nano-silicon thin film to form the low temperature polysilicon film.

13 Claims, 1 Drawing Sheet

(56) References Cited

U.S. PATENT DOCUMENTS

| | | | |
|---|---|---|---|
| 2003/0124871 A1* | 7/2003 | Arghavani et al. | 438/763 |
| 2012/0193633 A1* | 8/2012 | Kohno et al. | 257/66 |
| 2014/0065804 A1 | 3/2014 | Tian et al. | |

FOREIGN PATENT DOCUMENTS

| | | |
|---|---|---|
| CN | 102629558 A | 8/2012 |
| CN | 102709160 A | 10/2012 |
| WO | 2013066669 A2 | 5/2013 |

OTHER PUBLICATIONS

International Search Report Issued Jan. 10, 2014; Appln. No. PCT/CN2013/076957.

Ru Fang, et al; "Research on Preparation of Large Grain Size Polycrystalline Silicon Thin Films by Aluminum-induced Crystallization from Nanocrystalline Silicon", Journal of Synthetic Crystals, vol. 40, No. 6, Dec. 2011, pp. 1387-1393.

First Chinese Office Action dated Apr. 3, 2015; Appln. No. 201310150809.8.

* cited by examiner

LOW TEMPERATURE POLYSILICON FILM, THIN FILM TRANSISTOR, MANUFACTURING METHOD THEREOF AND DISPLAY PANEL

TECHNICAL FIELD

Embodiments of the present invention relate to a low temperature polysilicon film, a manufacturing method thereof, a thin film transistor and a manufacturing method thereof, as well as a display panel.

BACKGROUND

A low temperature polysilicon thin film transistor (LTPS-TFT) possesses better electrical performance than an amorphous silicon (a-Si) thin film transistor. The size of an LTPS-TFT may be smaller than that of an a-Si TFT, and thus light penetration rate can be increased, which in turn reduces the load of the backlight module of a liquid crystal display panel and extends the service life of the liquid crystal display panel. Furthermore, since a low temperature polysilicon film (LTPS) can be processed to form a high speed CMOS (Complementary Metal Oxide Semiconductor) driver circuit system on a substrate directly, which allows less pins for an external printed board and less connection points for wirings, lowering the probability of defects in the liquid crystal display panel and increasing the endurance.

In a low temperature polysilicon thin film transistor, a polysilicon thin film is used for an active layer. For the prior art technology, in the process of forming the polysilicon thin film active layer, an amorphous non-crystalline silicon thin film is first deposited as a precursor film, and then the precursor film is crystallized into a polysilicon film with e.g., excimer laser annealing. However, in this method, the pulsed laser generated by the excimer laser has a short pulse width and melting time thus obtained is of only tens of nanoseconds, and therefore the crystallization rate is fast, resulting in grains of small sizes, which tends to generate many grain boundaries in the channel, hence reducing carrier mobility and increasing leakage current. In addition, since an amorphous non-crystalline silicon thin film is used as the precursor film, and the non-crystalline silicon still has a high melting point, while the energy for laser crystallization is limited in a certain rage, and in case of low energy, non-crystalline silicon that can be completely molten concentrates in the superficial layer. For underlying layer, the temperature is lower than the melting point for crystallizing silicon, and therefore it exhibits a semi-molten state. The direction of crystallization will be growing upwards from the molten seed crystal, and the resulted polysilicon appear in columns, which further impacts improvements of the carrier mobility. However, if the energy density of incident laser is raised, it is likely to cause non-uniform crystalline particles with obvious bumps, which will impose disadvantageous influence on subsequent film deposition.

SUMMARY

Embodiments of the present invention provide a low temperature polysilicon film and a manufacturing method thereof, a thin film transistor and a manufacturing method thereof, as well as a display panel, which can reduce grain boundaries and defects and enhance quality of thin film transistors.

One aspect of the present invention provides a manufacturing method of a low temperature polysilicon film, wherein the low temperature polysilicon film is formed by crystallization with a nano-silicon thin film as a precursor.

For example, the method includes the following steps: depositing a nano-silicon film; de-hydrogening the deposited nano-silicon film; and crystallizing the nano-silicon film after the de-hydrogening to form a low temperature polysilicon film.

For example, a volume of crystalline nano-silicon grains contained in the deposited nano-silicon thin film accounts for 50-60% of a volume of the deposited nano-silicon thin film.

For example, the step of depositing the nano-silicon thin film includes: depositing the nano-silicon thin film with plasma enhanced chemical vapor deposition method.

For example, in the process of depositing the nano-silicon thin film with a plasma enhanced chemical vapor deposition process, a reacting gas is mixed gas of 99.999% silicane and 99.999% hydrogen in which the silicane's mass percentage in the mixed gas is 0.1-10%, a flow rate of the mixed gas is 100-1500 sccm, and an operation pressure is $10^{-2}$-$10^3$ Pa.

For example, in the process of depositing the nano-silicon thin film with a plasma enhanced chemical vapor deposition process, a radio frequency is 13.56 MHz, and a radio-frequency power is 30-500 W.

For example, in the process of depositing the nano-silicon thin film with a plasma enhanced chemical vapor deposition process, deposition time is 20 seconds to 30 minutes.

For example, a thickness of the deposited nano-silicon thin film is 30-100 nm.

For example, a particle size of nano-silicon in the deposited nano-silicon thin film is 1-40 nm, and an average particle size is 1-20 nm.

For example, the step of crystallizing the nano-silicon thin film to form a low temperature polysilicon film comprises: crystallizing the nano-silicon thin film to form the low temperature polysilicon film using an excimer laser annealing method, a solid phase crystallization method or a metal induced transverse crystallization method.

For example, in case that the step of crystallizing the nano-silicon thin film to form the low temperature polysilicon film is crystallizing the nano-silicon thin film with an excimer laser annealing method to form the low temperature polysilicon film, a laser pulse frequency is 200-400 Hz and a laser energy density is 240-250 mJ/cm$^2$.

Another aspect of the present invention provides a manufacturing method of a thin film transistor comprising preparing a low temperature polysilicon film by the manufacturing method of low temperature polysilicon film provided in an embodiment of the present invention as an active layer.

Yet another aspect of the present invention provides a low temperature polysilicon film manufactured by the method provided in an embodiment of the present invention.

Yet another aspect of the present invention provides a thin film transistor including the low temperature polysilicon film provided in an embodiment of the present invention.

Yet another aspect of the present invention provides a display panel including the thin film transistor provided in an embodiment of the present invention.

BRIEF DESCRIPTION OF THE DRAWINGS

For better understanding technical proposals according to embodiments of the present invention, drawings of the embodiments will be described briefly below. Obviously, drawings in the following description only relate to some embodiments of the present invention, not to limit the present invention.

REFERENCE NUMERALS

Figure 1:
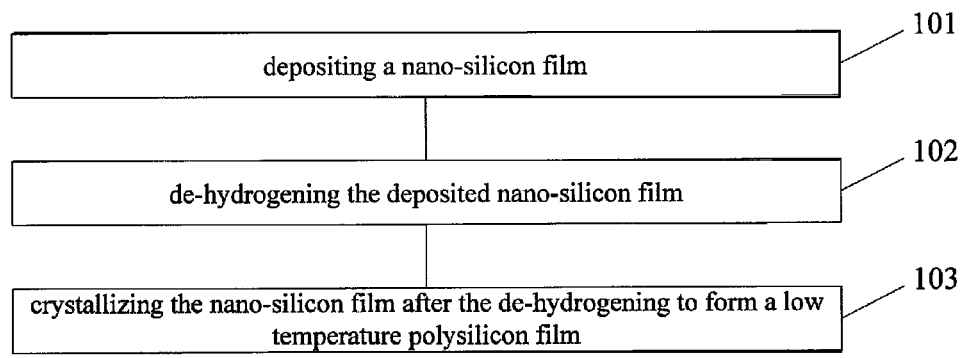
FIG. 1 is a flow chart showing a manufacturing method of a low temperature polysilicon film provided in embodiments of the present invention.

1: glass substrate;
2: buffer layer;
3: polysilicon thin film active layer
4: gate;
5: gate insulating layer;
3a: heavily doped source region on left side of the polysilicon thin film active layer;
3b: drain region on right side of the polysilicon thin film active layer
6: source;
7: drain
8: laser generated by excimer laser
9: travel direction of laser
10: nanometer silicon thin film layer
11: regions where laser interacts with the nano-silicon thin film to cause crystallization

DETAILED DESCRIPTION

In order to make the purpose, technology solution and advantages of embodiments of the present invention more clear, technology solutions according to embodiments of the present invention will be described clearly and completely below with respect to drawings of embodiments of the present invention. It is to be understood that the described embodiments are part of but not all of embodiments of the present invention. Based on the described embodiments of the present invention, all other embodiments obtained by those of ordinary skill in the art without any creative labor fall into the protecting scope of the present invention.

Unless otherwise defined, all the technical and scientific terms used herein have the same meanings as commonly understood by one of ordinary skill in the art to which the present invention belongs. The terms such as "a," "an," and "the" etc., are not intended to limit the amount, but indicate the existence of at lease one. Similar words such as "including" or "comprising" indicate elements or objects before them cover elements or objects listed after them or equivalents, while not excluding existence of other elements or objects. "On," "under," "right," "left" and the like are only used to indicate relative position relationship, and when the position of the object which is described is changed, the relative position relationship may be changed accordingly.

An embodiment of the present invention provides a manufacturing method for a low temperature polysilicon film that is formed by crystallizing a nano-silicon thin film as a precursor, that is, a nano-silicon thin film is used as the precursor thin film of the polysilicon thin film.

A low temperature polysilicon film (LTPS) is a kind of polysilicon films, and a high temperature polysilicon film (HTPS) is present as well. For a high temperature polysilicon film, in its preparation process, a high temperature annealing technology of over 1000° C. is required to convert the non-crystalline silicon of structural characteristics into a polysilicon structure. In contrast, the preparation process for low temperature polysilicon film is generally accomplished under a temperature below 600° C., which greatly decreases energy consumption with respect to high temperature polysilicon film.

A nano-silicon thin film is a low fibre material consisting of a great amount of silicon microcrystals of nanometer size and contains a certain amount of crystalline state components. For example, the crystalline state components (i.e., crystalline nano-silicon crystal grains) account for 40-70% volume in the nano-silicon thin film. Of course, this volume proportion is merely for illustration, those skilled in the art may select nano-silicon films with other volume proportion of crystalline state components according to the principle disclosed in the present specification.

The nano-silicon film may be formed by deposition with a PECVD (plasma enhanced chemical vapor deposition) method. It is understood that those skilled in the art may also form a nano-silicon film with other methods such as sputtering.

After forming a nano-silicon film with a certain amount of crystalline state components, the nano-silicon film may be crystallized to form a low temperature polysilicon film with ELA (Excimer Laser Annealing) method. It should be understood that those skilled in the art may also form the polysilicon film by crystallization with another method such as SPC (Solid Phase Crystallization) or MILC (Metal Induced Lateral Crystallization).

In the process of crystallizing the nano-silicon film into the low temperature polysilicon film with the above-mentioned method, the polysilicon thin film can grow with the crystalline nano-silicon crystal grain being used as seeds. Therefore, this leads to a polysilicon film thus formed by crystallization with large grain sizes, which reduces grain boundaries generated in the channel, thereby increasing carrier mobility, reducing leakage current and improving the quality of polysilicon film. Furthermore, crystallization with nano-silicon film as precursor overcomes the strict limitation on laser crystallization energy range when an amorphous non-crystalline silicon film is used as precursor, and can more easily control reaction conditions in production.

An embodiment of the present invention provides another manufacturing method for low temperature polysilicon film as shown in FIG. 1, which includes the following steps 101-103:

101, depositing a nano-silicon film.

Figure 2:
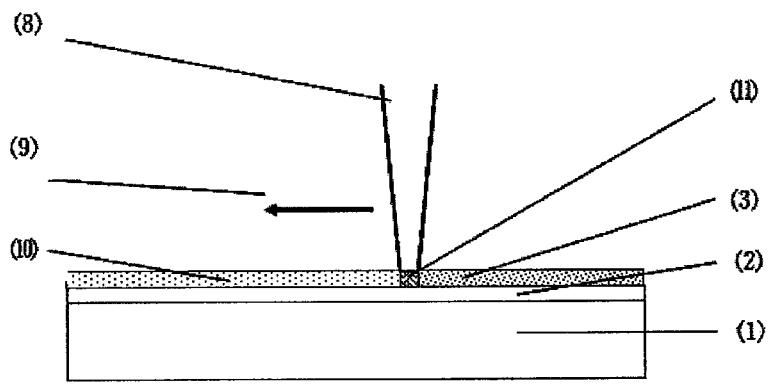
FIG. 2 is a schematic diagram of the manufacturing method for the low temperature polysilicon film in FIG. 1.

In this step, preferably, as shown in FIG. 2, a nano-silicon film 10 is deposited with a PECVD method. In the initial stage of the deposition of the nano-silicon film 10, there is no crystalline phase structure formed in the nano-silicon. The nano-silicon film 10 only contains minute nano-silicon of non-crystalline silicon structure and of small grains at nanometer level, that is, there are no crystalline state components in the nano-silicon film 10 now. During deposition, as the thickness of nano-silicon film 10 increases, particle size grows to gradually form highly crystallized nano-silicon crystal grains with small amount of crystalline phase.

Here, the PECVD method adopts a mixed gas of silicane ($SiH_4$) and hydrogen ($H_2$) as the reacting gases. The H radicals function to etch weak Si—Si bonds on surface of the nano-silicon film to remove them while leave strong Si—Si bonds, making the growing speed of the nano-silicon film 10 not too fast, allowing lattice structures with well-established bonds therein to remain while reducing disorder grid components to the minimum level, and thereby forming nano-silicon crystal grains. The nano-silicon crystal grains formed in this step account for 50-60% volume of the nano-silicon film.

It should be understood that the method may further include, prior to this step, a step of depositing a buffer layer on a glass substrate. The present invention does not impose any specific limitation thereto, and one skilled in the art may deposit the buffer layer according to well known knowledge in the art or common technical means. As shown in FIG. 2, a buffer layer 2 is firstly deposited on the glass substrate 1, and then a nano-silicon film 10 is deposited on the buffer layer 2.

102. de-hydrogening the deposited nano-silicon film.

In this step, the deposited nano-silicon film is subjected to a de-hydrogening process for 50-120 minutes under a temperature of e.g., 350-550° C. Preferably, it is annealed for 90 minutes under a temperature of 450° C.

103. Crystallizing the nano-silicon film after the de-hydrogening to form a low temperature polysilicon film.

In this step, an ELA method is used to crystallize the nano-silicon film to form the low temperature polysilicon film. As shown in FIG. 2 that illustrates a schematic diagram in which the laser generated by the excimer laser moves from right to left on the nano-silicon film 10 in the direction indicated by the arrow to crystallize it. Region 11 is the region of the nano-silicon film 10 that is currently crystallized, and on its right side is the polysilicon film active layer 3 that has been already crystallized.

The manufacturing method of low temperature polysilicon film provided in embodiment of the present invention adopts a PECVD method to deposit the nano-silicon film that contains nano-silicon crystal grains accounting for 50-60% volume of the nano-silicon film. Then, the nano-silicon film is de-hydrogened and the nano-silicon film is finally crystallized to form a low temperature polysilicon film. Since in the process of crystallizing the nano-silicon film into low temperature polysilicon film, the polysilicon film can grow with these crystalline nano-silicon grains as seeds, this leads to a polysilicon film thus formed by crystallization with large grain sizes, which reduces grain boundaries generated in the channel, thereby increasing carrier mobility, reducing leakage current and improving the quality of polysilicon film. Furthermore, crystallization with nano-silicon film as precursor overcomes the strict limitation on laser crystallization energy range when the amorphous non-crystalline silicon film is used as the precursor, and can more easily control reaction conditions in production.

In the process of forming nano-silicon film, it is desired to select suitable deposition process parameters to control the growth rate of nano-silicon film within a suitable range.

Therefore, in another embodiment provided in the present invention, the following process parameters can be used in step 101 to deposit the nano-silicon film. The reacting gas is a mixed gas of 99.999% silicane and 99.999% hydrogen. The mass percentage of silicane in the mixed gas is 0.1-10%, the flow rate of the mixed gas is 100-1500 sccm, and the operation pressure is $10^{-2}$-$10^{3}$ Pa. Further preferably, for example, the mass percentage of silicane in the mixed gas is 10%. Further preferably, for example, the operation air pressure is $10^{2}$ Pa.

Preferably, in order to further improve the quality of polysilicon film, in another embodiment provided in the present invention, the following process parameters can be used in step 101 to deposit the nano-silicon film. For example, the radio frequency is 13.56 MHz, and the radio-frequency power is 30-500 W. Further preferably, for example, the radio-frequency power is 100 W.

Preferably, in order to further improve the quality of polysilicon film, in another embodiment provided in the present invention, the following process parameters can be preferably used in step 101 to deposit the nano-silicon film. For example, the deposition time is 20 seconds-30 minutes.

Preferably, in order to further improve the quality of polysilicon film, in another embodiment provided in the present invention, the following process parameters can be used in step 101 to deposit the nano-silicon film. The thickness of the deposited nano-silicon film is for example 30-100 nm. Further preferably, the thickness of the nano-silicon film is for example 50 nm.

Preferably, in order to further improve the quality of polysilicon film, in another embodiment provided in the present invention, the following process parameters can be used in step 101 to deposit the nano-silicon film. The particle size of nano-silicon in the deposited nano-silicon film is for example 1-40 nm, and the average particle size is for example 1-20 nm. Further preferably, for example, the particle size of the nano-silicon is 20 nm. The nano-silicon includes both nano-silicon particles that form crystalline structures (crystal grains) and non-crystalline silicon particles that do not form crystalline phase structures.

Preferably, in order to further improve the quality of polysilicon film, in another embodiment provided in the present invention, the following process parameters can be used in step 103 to crystallize the nano-silicon film into the low temperature polysilicon film. The nano-silicon film is crystallized to form the low temperature polysilicon film with excimer laser annealing with for example a laser pulse frequency of 200-400 Hz and a laser energy density of 240-250 mJ/cm$^{2}$.

It is to be understood that process parameters for depositing nano-silicon film in the above-mentioned embodiments may be optionally combined for use, which will not be described in detail any more.

Corresponding to the above-mentioned manufacturing method of a low temperature polysilicon film, an embodiment of the present invention further provides a manufacturing method of a thin film transistor that includes the manufacturing method of low temperature polysilicon film provided in embodiments of the present invention. With the manufacturing method of a thin film transistor provided in the embodiment of the present invention, the low temperature polysilicon film serving as the active layer in the thin film transistor is formed by crystallizing the nano-silicon film, resulting in a polysilicon film thus formed by crystallization with large grain sizes, which reduces grain boundaries generated in the channel of the active layer, thereby increasing carrier mobility, reducing leakage current and improving the quality of polysilicon film. Furthermore, crystallization with nano-silicon film as precursor overcomes the strict limitation on laser crystallization energy range when the amorphous non-crystalline silicon film is used as the precursor, and can more easily control reaction conditions in production.

Corresponding to the above-mentioned manufacturing methods of low temperature polysilicon film, an embodiment of the present invention further provide a low temperature polysilicon film that is prepared by the above-mentioned manufacturing methods of low temperature polysilicon film provided in the embodiments of the present invention. As shown in FIG. 2, the layer 3 is the polysilicon film serving as active layer and prepared by the manufacturing methods of low temperature polysilicon film in the above-mentioned embodiments.

The low temperature polysilicon film provided in the embodiment of the present invention is formed by crystallizing the nano-silicon film, which reduces grain boundaries generated in the channel, thereby increasing carrier mobility, reducing leakage current and improving the quality of polysilicon film. Furthermore, crystallization with nano-silicon film as precursor overcomes the strict limitation on laser crystallization energy range when the amorphous non-crystalline silicon film is used as the precursor, and can more easily control reaction conditions in production.

Corresponding to the above-mentioned low temperature polysilicon film, an embodiment of the present invention further provides a thin film transistor that includes a low temperature polysilicon film provided in the embodiment of the present invention.

Figure 3:
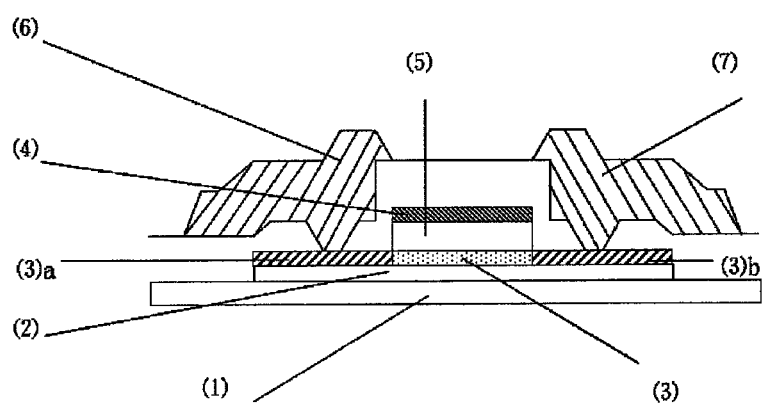
FIG. 3 is a structure schematic diagram of a thin film transistor provided in embodiments of the present invention.

FIG. 3 illustrates the thin film transistor using the low temperature polysilicon film provided in the embodiment of the present invention as the active layer. The thin film transistor includes a glass substrate 1, a buffer layer 2, a polysilicon film active layer 3, a gate 4, a gate insulating layer 5, a heavily doped source region 3a on the left side of the polysilicon thin film active layer, a drain region 3b on the right side of the polysilicon thin film active layer, a source electrode 6, and a drain electrode 7. It is to be understood that FIG. 3 is merely a schematic illustration of the thin film transistor provided in the embodiment of the present invention, and those skilled in the art can obtain a transistor, including the low temperature polysilicon film of the present invention, in another form according to well known knowledge in the art or common technology means. The glass substrate may be replaced with a plastic substrate.

The thin film transistor provided in the embodiment of the present invention uses the low temperature polysilicon film formed by crystallizing the nano-silicon film as the active layer, which results in large grain sizes in the polysilicon film thus formed by crystallization and reduces grain boundaries generated in the channel, thereby increasing carrier mobility, reducing leakage current and improving the quality of the thin film transistor. Furthermore, crystallization with nano-silicon film as precursor overcomes the strict limitation on laser crystallization energy range when the amorphous non-crystalline silicon film is used as the precursor, and can more easily control reaction conditions in production.

Corresponding to the above-mentioned thin film transistor, an embodiment of the present invention furthers provide a display panel including the thin film transistor provided in the embodiments of the present invention. For the display panel provided in the embodiment of the present invention, the low temperature polysilicon film in its thin film transistor is formed by crystallizing the nano-silicon film, which results in large grain sizes in the polysilicon film thus formed by crystallization and reduces grain boundaries generated in the channel, thereby increasing carrier mobility, reducing leakage current and improving the quality of the polysilicon film. Furthermore, crystallization with nano-silicon film as precursor overcomes the strict limitation on laser crystallization energy range when the amorphous non-crystalline silicon film is used as the precursor, and can more easily control reaction conditions in production.

In order to better explain the above-mentioned low temperature polysilicon film and the manufacturing method thereof, detail description will be given below along with four specific examples.

Example 1

$SiN_x$ of a thickness of 80 nm and $SiO_2$ of a thickness of 100 nm are respectively deposited on a glass substrate with a PECVD process to form a double layer buffer layer of $SiN_x$ and $SiO_2$.

A nano-silicon thin film layer is deposited on the double buffer layer with a PECVD process. Process parameters are as follows: the reacting gas is a mixed gas of 99.999% silicane ($SiH_4$) and 99.999% hydrogen ($H_2$), with the content of silicane of 1 wt %; the flow rate of the mixed gas is 300 sccm; the radio frequency is 13.56 MHz; the radio-frequency power is 100 W; the operation air pressure is 100 Pa; the temperature of the glass substrate is 180° C.; and the deposition time is 10 minutes. A nano-silicon thin film layer is obtained by deposition with the above-mentioned process parameters. After testing, the obtained nano-silicon thin film has a thickness of 40 nm, an average particle size of nano-silicon of 15 nm, and crystalline nano-silicon grains account for 52% volume of the nano-silicon thin film.

The nano-silicon thin film layer is subjected to a de-hydrogening process under 450° C. for 90 minutes, and then the nano-silicon thin film layer is subjected to XeCl excimer laser annealing. The process parameters are as follows: the temperature of the glass substrate is 350° C., the environmental atmosphere is nitrogen protective atmosphere of 20 Pa, the laser pulse frequency is 300 Hz, and the laser energy density is 250 mJ/cm². Under the above-mentioned process parameters, the nano-silicon thin film layer is crystallized into a polysilicon thin film layer.

Example 2

$SiN_x$ of a thickness of 80 nm and $SiO_2$ of a thickness of 100 nm are respectively deposited on a glass substrate with a PECVD process to form a double layer buffer layer of $SiN_x$ and $SiO_2$.

A nano-silicon thin film layer is deposited on the double buffer layer with a PECVD process. Process parameters are as follows: the reacting gas is a mixed gas of 99.999% silicane ($SiH_4$) and 99.999% hydrogen ($H_2$), with the content of silicane of 0.8 wt %; the flow rate of the mixed gas is 250 sccm; the radio frequency is 13.56 MHz; the radio-frequency power is 150 W; the operation air pressure is 150 Pa; the temperature of the glass substrate is 200° C.; and the deposition time is 12 minutes. A nano-silicon thin film layer is obtained by deposition under the above-mentioned process parameters. After testing, the obtained nano-silicon thin film has a thickness of 50 nm, an average particle size of nano-silicon of 18 nm, and crystalline nano-silicon grains account for 57% volume of the nano-silicon thin film.

The nano-silicon thin film layer is subjected to a de-hydrogening process under 450° C. for 90 minutes, and then the nano-silicon thin film layer is subjected to XeCl excimer laser annealing. The process parameters are as follows: the temperature of the glass substrate is 350° C., the environmental atmosphere is nitrogen protective atmosphere of 10 Pa, the laser pulse frequency is 300 Hz, and the laser energy density is 240 mJ/cm². Under the above-mentioned process parameters, the nano-silicon thin film layer is crystallized into a polysilicon thin film layer.

Example 3

$SiN_x$ of a thickness of 80 nm and $SiO_2$ of a thickness of 100 nm are respectively deposited on a glass substrate with a PECVD process to form a double layer buffer layer of $SiN_x$ and $SiO_2$.

A nano-silicon thin film layer is deposited on the double buffer layer with a PECVD process. Process parameters are as follows: the reacting gas is a mixed gas of 99.999% silicane ($SiH_4$) and 99.999% hydrogen ($H_2$), with the content of silicane of 1 wt %; the flow rate of the mixed gas is 1300 sccm; the radio frequency is 13.56 MHz; the radio-frequency power is 200 W; the operation air pressure is 100 Pa; the temperature of the glass substrate is 180° C.; and the deposition time is 10 minutes. A nano-silicon thin film layer is obtained by deposition under the above-mentioned process parameters. After testing, the obtained nano-silicon thin film has a thickness of 70 nm, an average particle size of nano-silicon of 5 nm, and crystalline nano-silicon grains account for 55% volume of the nano-silicon thin film.

The nano-silicon thin film layer is subjected to a de-hydrogening process under 480° C. for 85 minutes, and then the nano-silicon thin film layer is subjected to XeCl excimer laser annealing. The process parameters are as follows: the temperature of the glass substrate is 350° C., the environmental atmosphere is nitrogen protective atmosphere of 20 Pa, the laser pulse frequency is 220 Hz, and the laser energy density is 250 mJ/cm$^2$. Under the above-mentioned process parameters, the nano-silicon thin film layer is crystallized into a polysilicon thin film layer.

Example 4

$SiN_x$ of a thickness of 80 nm and $SiO_2$ of a thickness of 100 nm are respectively deposited on a glass substrate with a PECVD process to form a double layer buffer layer of $SiN_x$ and $SiO_2$.

A nano-silicon thin film layer is deposited on the double buffer layer with a PECVD process. Process parameters are as follows: the reacting gas is a mixed gas of 99.999% silicane ($SiH_4$) and 99.999% hydrogen ($H_2$), with the content of silicane of 1 wt %; the flow rate of the mixed gas is 200 sccm; the radio frequency is 13.56 MHz; the radio-frequency power is 400 W; the operation air pressure is 100 Pa; the temperature of the glass substrate is 180° C.; and the deposition time is 10 minutes. A nano-silicon thin film layer is obtained by deposition under the above-mentioned process parameters. After testing, the obtained nano-silicon thin film has a thickness of 100 nm, an average particle size of nano-silicon of 12 nm, and crystalline nano-silicon grains account for 54% volume of the nano-silicon thin film.

The nano-silicon thin film layer is subjected to a de-hydrogening process under 320° C. for 110 minutes, and then the nano-silicon thin film layer is subjected to XeCl excimer laser annealing. The process parameters are as follows: the temperature of the glass substrate is 350° C., the environmental atmosphere is nitrogen protective atmosphere of 20 Pa, the laser pulse frequency is 350 Hz, and the laser energy density is 250 mJ/cm$^2$. Under the above-mentioned process parameters, the nano-silicon thin film layer is crystallized into a polysilicon thin film layer.

Example 5

$SiN_x$ of a thickness of 80 nm and $SiO_2$ of a thickness of 100 nm are respectively deposited on a glass substrate with a PECVD process to form a double layer buffer layer of $SiN_x$ and $SiO_2$.

A nano-silicon thin film layer is deposited on the double buffer layer with a PECVD process. Process parameters are as follows: reacting gas is mixed gas of 99.999% silicane ($SiH_4$) and 99.999% hydrogen ($H_2$), with the content of silicane of 1 wt %; the flow rate of the mixed gas is 100 sccm; the radio frequency is 13.56 MHz; the radio-frequency power is 30 W; the operation air pressure is $10^{-2}$ Pa; the temperature of the glass substrate is 180° C.; and the deposition time is 20 seconds. A nano-silicon thin film layer is obtained by deposition under the above-mentioned process parameters. By testing, the obtained nano-silicon thin film has a thickness of 30 nm, an average particle size of nano-silicon of 1 nm, and crystalline nano-silicon grains account for 50% volume of the nano-silicon thin film.

The nano-silicon thin film layer is subjected to a de-hydrogening process under 320° C. for 110 minutes, and then the nano-silicon thin film layer is subjected to XeCl excimer laser annealing. The process parameters are as follows: the temperature of the glass substrate is 350° C., the environmental atmosphere is a protective atmosphere of 20 Pa nitrogen, the laser pulse frequency is 200 Hz, and the laser energy density is 245 mJ/cm$^2$. Under the above-mentioned process parameters, the nano-silicon thin film layer is crystallized into a polysilicon thin film layer.

Example 6

$SiN_x$ of a thickness of 80 nm and $SiO_2$ of a thickness of 100 nm are respectively deposited on a glass substrate with a PECVD process to form a double layer buffer layer of $SiN_x$ and $SiO_2$.

A nano-silicon thin film layer is deposited on the double buffer layer with a PECVD process. Process parameters are as follows: the reacting gas is a mixed gas of 99.999% silicane (SiH4) and 99.999% hydrogen (H2), with the content of silicane of 1 wt %; the flow rate of the mixed gas is 1500 sccm; the radio frequency is 13.56 MHz; the radio-frequency power is 500 W; the operation air pressure is 1000 Pa; the temperature of the glass substrate is 180° C.; and the deposition time is 30 minutes. A nano-silicon thin film layer is obtained by deposition under the above-mentioned process parameters. By testing, the obtained nano-silicon thin film has a thickness of 90 nm, an average particle size of nano-silicon of 40 nm, and crystalline nano-silicon grains account for 60% volume of the nano-silicon thin film.

The nano-silicon thin film layer is subjected to a de-hydrogening process under 320° C. for 110 minutes, and then the nano-silicon thin film layer is subjected to XeCl excimer laser annealing. The process parameters are as follows: the temperature of the glass substrate is 350° C., the environmental atmosphere is nitrogen protective atmosphere of 20 Pa, the laser pulse frequency is 400 Hz, and the laser energy density is 248 mJ/cm$^2$. Under the above-mentioned process parameters, the nano-silicon thin film layer is crystallized into a polysilicon thin film layer.

The above is only exemplary implementations of the present invention, rather than for limiting protection scope of the present invention, which is defined by the appended claims.

The invention claimed is:

1. A manufacturing method of a low temperature polysilicon film, comprising:
    forming the low temperature polysilicon film by crystallization with a nano-silicon thin film as a precursor,
    wherein forming the low temperature polysilicon film by crystallization with a nano-silicon thin film as a precursor comprises steps of:
    depositing a nano-silicon film;
    de-hydrogenation the deposited nano-silicon film; and
    crystallizing the nano-silicon film after the de-hydrogenation to form a low temperature polysilicon film;
    wherein a volume of crystalline nano-silicon grains contained in the deposited nano-silicon thin film accounts for 50-60% of a volume of the deposited nano-silicon thin film.

2. The manufacturing method of claim 1, wherein the step of depositing the nano-silicon thin film comprises depositing the nano-silicon thin film with a plasma enhanced chemical vapor deposition process.

3. The manufacturing method of claim 2, wherein in the process of depositing the nano-silicon thin film with a plasma enhanced chemical vapor deposition process, a reacting gas is a mixed gas of 99.999% silicane and 99.999% hydrogen in which the silicane's mass percentage in the mixed gas is 0.1-10%, a flow rate of the mixed gas is 100-1500 sccm, and an operation pressure is $10^{-2}$-$10^3$ Pa.

4. The manufacturing method of claim 2, wherein in the process of depositing the nano-silicon thin film with a plasma enhanced chemical vapor deposition process, a radio frequency is 13.56 MHz, and a radio-frequency power is 30-500 W.

5. The manufacturing method of claim 2, wherein in the process of depositing the nano-silicon thin film with a plasma enhanced chemical vapor deposition process, deposition time is 20 seconds to 30 minutes.

6. The manufacturing method of claim 2, wherein a thickness of the deposited nano-silicon thin film is 30-100 nm.

7. The manufacturing method of claim 2, wherein a particle size of nano-silicon in the deposited nano-silicon thin film is 1-40 nm, and an average particle size is 1-20 nm.

8. The manufacturing method of claim 2, wherein the step of crystallizing the nano-silicon thin film to form a low temperature polysilicon film comprises:

crystallizing the nano-silicon thin film to form the low temperature polysilicon film using an excimer laser annealing method, a solid phase crystallization method or a metal induced transverse crystallization method.

9. The manufacturing method of claim 8, wherein in case that the step of crystallizing the nano-silicon thin film to form the low temperature polysilicon film is crystallizing the nano-silicon thin film with an excimer laser annealing method to form the low temperature polysilicon film, a laser pulse frequency is 200-400 Hz and a laser energy density is 240-250 mJ/cm$^2$.

10. A manufacturing method of a thin film transistor comprising preparing a low temperature polysilicon film by the manufacturing method of low temperature polysilicon film according to claim 1 as an active layer.

11. A low temperature polysilicon film manufactured by the method according to claim 1.

12. A thin film transistor comprising a low temperature polysilicon film according to claim 11.

13. A display panel comprising the thin film transistor according to claim 12.

* * * * *